United States Patent
Hong

[11] Patent Number: 6,035,530
[45] Date of Patent: Mar. 14, 2000

[54] METHOD OF MANUFACTURING INTERCONNECT

[75] Inventor: Gary Hong, Hsinchu, Taiwan

[73] Assignee: United Semiconductor Corp., Hsinchu, Taiwan

[21] Appl. No.: 09/306,130

[22] Filed: May 6, 1999

[30] Foreign Application Priority Data

Mar. 19, 1999 [TW] Taiwan ................................. 88104317

[51] Int. Cl.⁷ ..................................................... H01R 43/00
[52] U.S. Cl. .................. 29/885; 29/874; 29/825; 29/846; 29/850; 438/129; 438/618; 438/622
[58] Field of Search .............................. 29/885, 874, 825, 29/876, 846, 850; 438/129, 130, 618, 622; 174/255, 261

[56] References Cited

U.S. PATENT DOCUMENTS 4,313,262 2/1982 Barnes et al. ............................. 29/840
5,750,415 5/1998 Gnade et al. ............................ 437/195

*Primary Examiner*—Lee Young
*Assistant Examiner*—Rhonda E. Sands
*Attorney, Agent, or Firm*—Jiawei Huang; J. C. Patents

[57] ABSTRACT

A method for manufacturing an interconnect. A substrate having a first dielectric layer and a barrier layer formed thereon is provided. A plurality of conductive wires is formed on the barrier layer. A second dielectric layer is formed on the barrier layer exposed by the conductive wires, wherein the second dielectric layer has a surface level between the top surfaces and the bottom surfaces of the conductive wires. A spacer is formed on each portion of the sidewalls of the conductive wires exposed by the second dielectric layer, wherein there is a gap between two adjacent spacers. The second dielectric layer is removed. A third dielectric layer is formed on the conductive wires, the spacer, the sidewalls of the conductive wires and the portion of the barrier layer exposed by the conductive wires and fills the gap to form an air cavity between the conductive wires under the spacer.

19 Claims, 3 Drawing Sheets

METHOD OF MANUFACTURING INTERCONNECT

CROSS-REFERENCE TO RELATED APPLICATION

This application claims the priority benefit of Taiwan application Ser. No. 88104317, filed Mar. 19, 1999, the full disclosure of which is incorporated herein by reference.

BACKGROUND OF THE INVENTION

1. Field of the Invention

The present invention relates to a method of manufacturing an interconnect. More particularly, the present invention relates to a method of manufacturing an interconnect in a high density integrated circuit device.

2. Description of the Related Art

Due to the increasingly high integration of ICs, chips simply cannot provide sufficient area for manufacturing interconnections. Therefore, in accord with the increased interconnects manufacturing requirements of miniaturized MOS transistors, it is increasingly necessary for IC manufacturing to adopt a design with more than two conductive layers. Commonly, the material of the conductive layer can be polysilicon or conductive metal. Generally, an inter-metal dielectric (IMD) layer is used to electrically isolate two adjacent conductive layers from each other. Moreover, a conductive layer used to electrically connect the two adjacent metal layers is called a via plug.

Typically, the parasitic capacitor effect easily happens between conductive wires. The parasitic capacitor effect induces resistor-capacitor time delay (RC time delay), so that the operation rate of the device is slow. Paracitic capacitance becomes increasingly serious as the size of the device reduces and integrated circuit device density becomes higher.

SUMMARY OF THE INVENTION

The invention provides a method of manufacturing an interconnect. By using the invention, the parasitic capacitor effect can be decreased. Moreover, the operation rate of the device is relatively fast and the reliability is relatively high.

To achieve these and other advantages and in accordance with the purpose of the invention, as embodied and broadly described herein, the invention provides a method of manufacturing an interconnect. A substrate is provided. A first dielectric layer is formed on the substrate. A barrier layer is formed on the first dielectric layer. A plurality of conductive wires is formed on the barrier layer. A second dielectric layer is formed on the barrier layer exposed by the conductive wires, wherein the second dielectric layer has a surface level between the top surfaces and the bottom surfaces of the conductive wires and a portion of sidewalls of the conductive wires is exposed by the second dielectric layer. A spacer is formed on each portion of the sidewalls of the conductive wires exposed by the second dielectric layer, wherein there is a gap between two adjacent spacers. The second dielectric layer is removed. A third dielectric layer is formed on the conductive wires, the spacer, the sidewalls of the conductive wires and the portion of the barrier layer exposed by the conductive wires. The third dielectric layer fills the gap to form an air cavity between the conductive wires under the spacer, wherein the air cavity is full of air having a dielectric constant of about 1. Since the air cavity is good for decreasing the capacitance between the conductive wires, the operation rate of the device is relatively fast and the reliability is relatively high.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
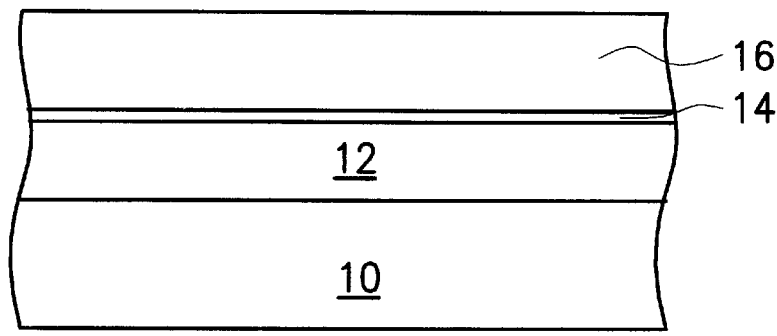
FIGS. 1–7 are schematic, cross-sectional views of the process for manufacturing an interconnect in a preferred embodiment according to the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1 through 7 are schematic, cross-sectional views of the process for manufacturing an interconnect in a preferred embodiment according to the invention.

As shown in FIG. 1, a substrate 10 having devices (not shown) previously formed thereon and therein is provided. The devices can be electrically coupled to other devices (not shown) or I/O terminals (not shown). A dielectric layer 12 is formed on the substrate 10. The thickness of the dielectric layer 12 is at least 1000 angstroms, for example. In this example, the dielectric layer 12 has vertical structure (not shown) such as plug or node contact. The dielectric layer 12 can be formed from silicon oxide by chemical vapor deposition (CVD), plasma enhanced chemical vapor deposition (PECVD), atmospheric pressure chemical vapor deposition (APCVD) or low pressure chemical vapor deposition (LPCVD) with reaction gases such as silane and oxygen or tetraethylorthosilicate (TEOS), for example. The dielectric layer 12 can be further treated by a planarizing step to planarize the surface of the dielectric layer 12. The planarizing step can be etching back or chemical-mechanical polishing (CMP), for example. The thickness of the dielectric layer 12 can be adjusted according to the surface structure of the substrate 10. A barrier layer 14 is formed on the dielectric layer 12. The material of the barrier layer 14 can be silicon nitride or silicon-oxynitride, for example. The material of the barrier layer 14 is different from that of the dielectric layer 12. The thickness of the barrier layer 14 is of about 200–1500 angstroms. A conductive layer 16 is formed on the barrier layer 14. The conductive layer 16 can be formed from aluminum by sputtering or CVD, for example.

Figure 2:
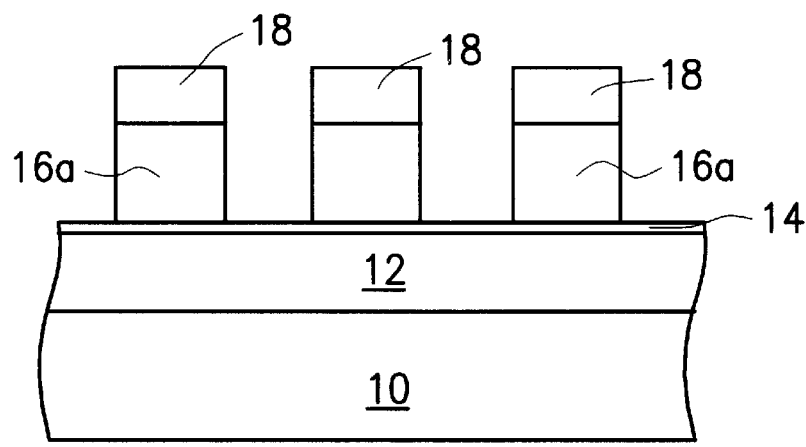

As shown in FIG. 2, the conductive layer 16 is patterned by photolithography. In this example, the process for patterning the conductive layer 16 comprises the steps of forming a patterned photoresist 18 on the conductive layer 16. An etching step is performed to remove a portion of the conductive layer 16 by using the patterned photoresist 18 as a mask and using the barrier layer 14 as an etching stop layer. The remaining conductive layer 16 is denoted as conductive line 16a.

Figure 3:
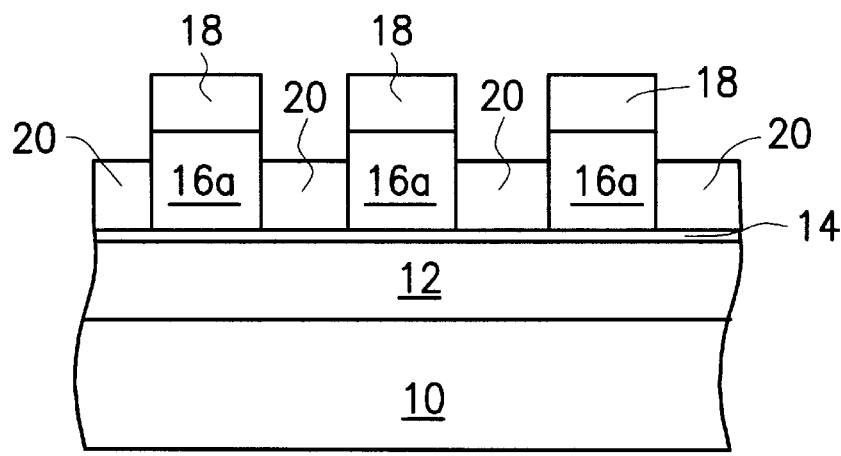

As shown in FIG. 3, a dielectric layer 20 with a surface level between the top surface and the bottom surface of the conductive wire 16a is formed on a portion of the barrier layer 14 exposed by the conductive wire 16. The material of the dielectric layer 20 is similar to that of the dielectric layer 12 but is different from that of the barrier layer 14. The dielectric layer 20 can be formed from silicon oxide by CVD with reaction gases such as silane or TEOS, for example. In this example, the method of forming the dielectric layer 20 comprises the steps of forming a dielectric layer to cover the conductive wire 16a and the photoresist 18. An etching back step is performed to form the dielectric layer 20 with the surface level between the top surface and the bottom surface of the conductive wire 16a. In addition to the method for forming the dielectric layer 20 mentioned above, the dielectric layer 20 can be further formed by a selective liquid phase deposition (LPD). By using LPD, the dielectric layer 20 is selectively formed on the barrier layer 14 but is not formed on the photoresist 18. The photoresist 18 covers the conductive wire 16a, so that the dielectric layer 20 is automatically formed in a space between the conductive wires 16a covered by the photoresist 18. The thickness of the dielectric layer 20 varies with the thickness of the conductive wire 16a until the top surface level of the dielectric layer 20 is lower than that of the conductive wire 16aTherefore, the dielectric layer 20 can be formed by performing the LPD just once without performing the etching back step.

Figure 4:
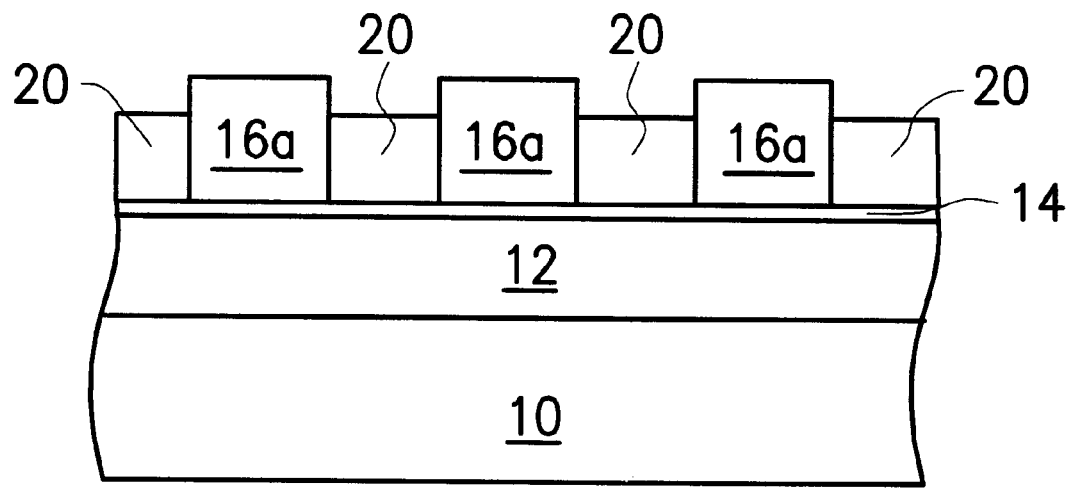

As shown in FIG. 4, the photoresist 18 is removed until the top surface of the conductive wire 16a is exposed. Since the top surface level of the conductive wire 16a is higher than that of the dielectric layer 20, a portion of the sidewall of the conductive wire 16a is exposed.

Figure 5:
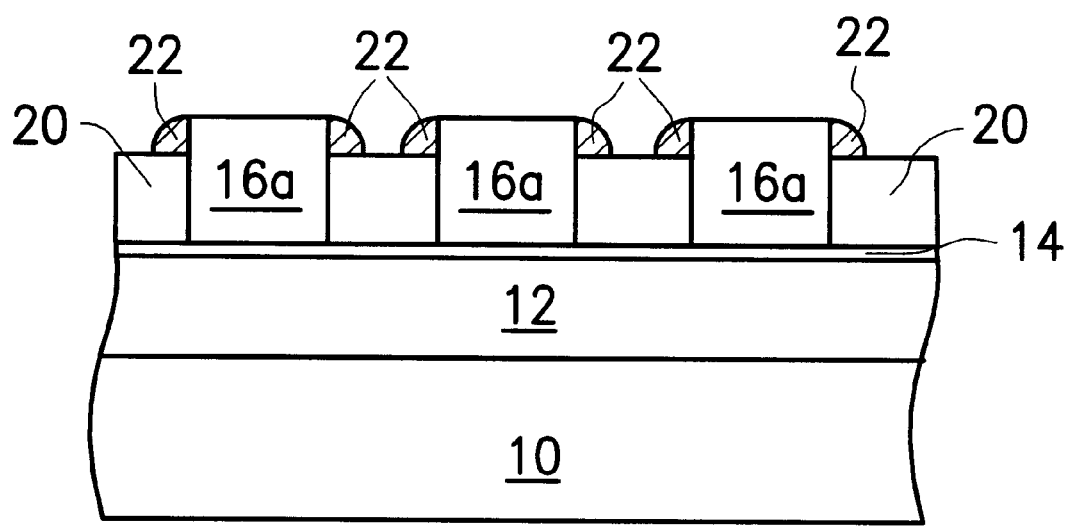

As shown in FIG. 5, a spacer 22 is formed on the exposed sidewall of the conductive wire 16aThe bottom of the spacer 22 is on a portion of the dielectric layer 20. The spacer 22 can be made from silicon nitride or silicon-oxy-nitride, for example. In this example, the method of forming the spacer 22 comprises the steps of forming a silicon nitride layer (or a silicon-oxy-nitride layer) over the substrate 10. An anisotropic etching step is performed to remove a portion of the silicon nitride layer (or the silicon-oxy-nitride) and to form the spacer 22.

Figure 6:
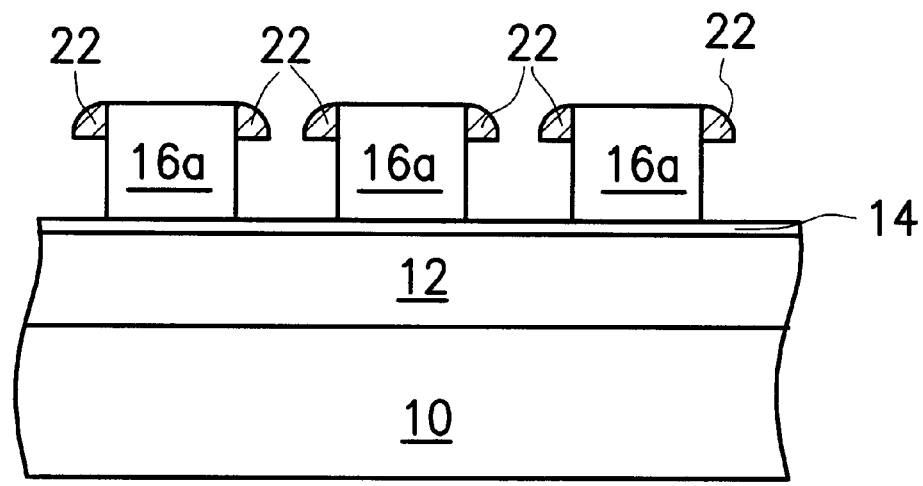

As shown in FIG. 6, the dielectric layer 20 is removed to expose the bottom surface of the spacer 22, a portion of the sidewall of the conductive wire 16a exposed by the spacer 22, and the portion of the barrier layer 14 exposed by the conductive wire 16aThe spacer 22 is left on the portion of the sidewall of the conductive wire 16a.

Figure 7:
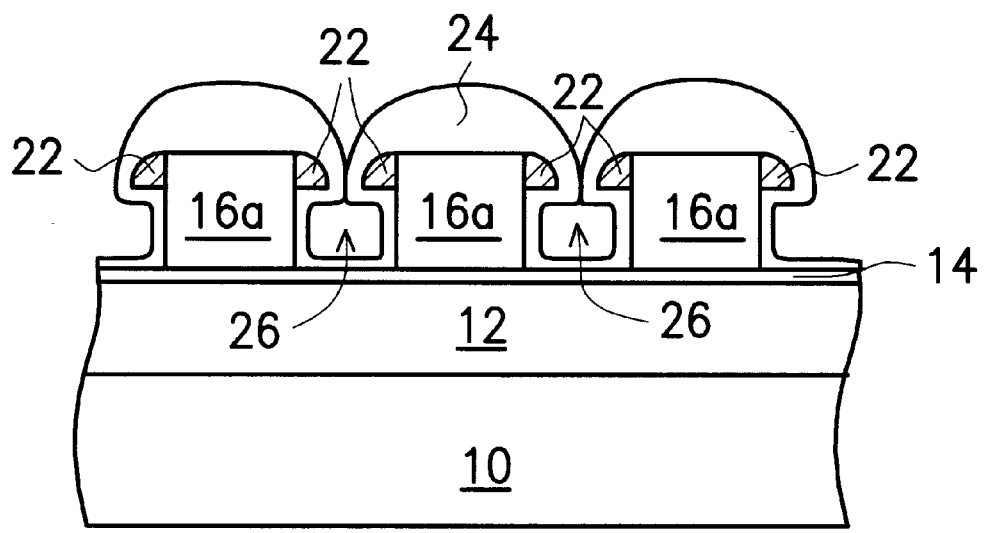

As shown in FIG. 7, a dielectric layer 24 is formed on the conductive wire 16a, the portion of the sidewall of the conductive wire 16a exposed by the spacer 22, the spacer 22 and the portion of the barrier layer 14 exposed by the conductive wire 16a. Moreover, the dielectric layer 24 fills a gap between the two adjacent spacers 22, while the exposed sidewall of the conductive wires 16a is remained uncovered. Therefore, an air cavity 26 is formed between the conductive wires 16a under the spacer 22 and the dielectric layer 24, wherein the air cavity 26 is full of air having a dielectric constant of about 1. The dielectric layer 24 can be formed from silicon oxide by APCVD and LPCVD. The result of the formation of the air cavity 26 is that the gap between the spacers 22 is relatively narrow and the spacers 22 are used as a mask when the dielectric layer 24 is formed by deposition. Therefore, only a bit of the silicon oxide material can penetrate through the gap and deposit on the portion of the sidewall of the conductive wire 16a exposed by the spacer 22, on the barrier layer 14 exposed by the conductive wire 16a and the bottom of the spacer 22. Hence, the air cavity 26 is formed between the conductive wires 16a to finish the process for manufacturing the interconnect structure.

In the invention, the dielectric constant of the air in the air cavity 26 is of about 1. Generally, the dielectric constant of a common material is larger than 1, so that the dielectric constant of the air which is about 1 is less than that of any other material. Therefore, the air cavity 16 is good for decreasing the capacitance between the conductive wires 16a. By using the invention, the operation rate of the device is relatively fast and the reliability is relatively high.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing an interconnect, comprising the steps of:

providing a substrate;

forming a first dielectric layer on the substrate;

forming a barrier layer on the first dielectric layer;

forming a plurality of conductive wires on the barrier layer;

forming a second dielectric layer on the barrier layer exposed by the conductive wires, wherein the second dielectric layer has a surface level between top surfaces and bottom surfaces of the conductive wires and a portion of each sidewall of the conductive wires is exposed by the second dielectric layer;

forming a spacer on each portion of the sidewalls of the conductive wires exposed by the second dielectric layer, wherein there is a gap between two adjacent spacers;

removing the second dielectric layer; and forming a third dielectric layer on the conductive wires, the spacer, the sidewalls of the conductive wires and the portion of the barrier layer exposed by the conductive wires, and filling the gap to form an air cavity between the conductive wires under the spacer, wherein the air cavity is full of air having a dielectric constant of about 1.

2. The method of claim 1, wherein a first dielectric layer material includes silicon oxide.

3. The method of claim 1, wherein a barrier layer material includes silicon nitride.

4. The method of claim 1, wherein a barrier layer material includes silicon-oxy-nitride.

5. The method of claim 1, wherein a conductive wire material includes aluminum.

6. The method of claim 1, wherein a second dielectric layer material includes silicon oxide.

7. The method of claim 1, wherein the second dielectric layer can be formed from silicon oxide by selective liquid phase deposition.

8. The method of claim 1, wherein material of the spacer includes silicon nitride.

9. The method of claim 1, wherein material of the spacer includes silicon-oxy-nitride.

10. The method of claim 1, wherein material of the third dielectric layer includes silicon oxide.

11. A method of manufacturing an interconnect, comprising the steps of:

providing a substrate having a first dielectric layer and a barrier layer formed thereon;

forming a plurality of conductive wires on the barrier layer;

performing a selective liquid phase deposition to form a second dielectric layer on the barrier layer exposed by the conductive wires, wherein the second dielectric layer has a surface level between the top surfaces and the bottom surfaces of the conductive wires and a portion of sidewalls of the conductive wires is exposed by the second dielectric layer;

forming a spacer on each portion of the sidewalls of the conductive wires exposed by the second dielectric layer, wherein there is a gap between two adjacent spacers;

removing the second dielectric layer; and forming a third dielectric layer on the conductive wires, the spacer, the sidewalls of the conductive wires and the portion of the barrier layer exposed by the conductive wires and filling the gap to form an air cavity between the conductive wires under the spacer, wherein the air cavity is full of air having a dielectric constant of about 1.

12. The method of claim 11, wherein a first dielectric layer material includes silicon oxide.

13. The method of claim 11, wherein a barrier layer material includes silicon nitride.

14. The method of claim 11, wherein a barrier layer material includes silicon-oxy-nitride.

15. The method of claim 11, wherein a conductive wire material includes aluminum.

16. The method of claim 11, wherein a second dielectric layer material includes silicon oxide.

17. The method of claim 11, wherein a spacer material includes silicon nitride.

18. The method of claim 11, wherein a spacer material includes silicon-oxy-nitride.

19. The method of claim 11, wherein a third dielectric layer material includes silicon oxide.

* * * * *